United States Patent

[11] 3,609,572

[72] Inventor Alan J. De Vilbis
Colorado Springs, Colo.
[21] Appl. No. 838,532
[22] Filed July 2, 1969
[45] Patented Sept. 28, 1971
[73] Assignee Hewlett-Packard Company
Palo Alto, Calif.

[54] SIGNALLING CIRCUIT
2 Claims, 2 Drawing Figs.

[52] U.S. Cl. .......... 330/30, 330/19, 330/22
[51] Int. Cl. .......... H03j 3/68
[50] Field of Search .......... 330/19, 20, 22, 30, 147, 25

[56] References Cited

UNITED STATES PATENTS

| | | | |
|---|---|---|---|
| 3,487,324 | 12/1969 | Jones | 330/30 |
| 2,719,190 | 9/1955 | Raisbeck | 330/20 X |
| 3,015,780 | 2/1962 | Schayes et al. | 330/20 X |

*Primary Examiner*—Roy Lake
*Assistant Examiner*—Lawrence J. Dahl
*Attorney*—A. C. Smith

ABSTRACT: A signal circuit for an oscilloscope includes iterative gain stages and signal-controlled attenuators which may be operated as gain verniers or as channel switches for multiplexed signal mixing. Bias currents in the active elements of gain stages near the output stage are shared with the active elements of preceding stages to reduce the total quiescent current requirement.

PATENTED SEP 28 1971 3,609,572

SHEET 1 OF 2

Figure 2:
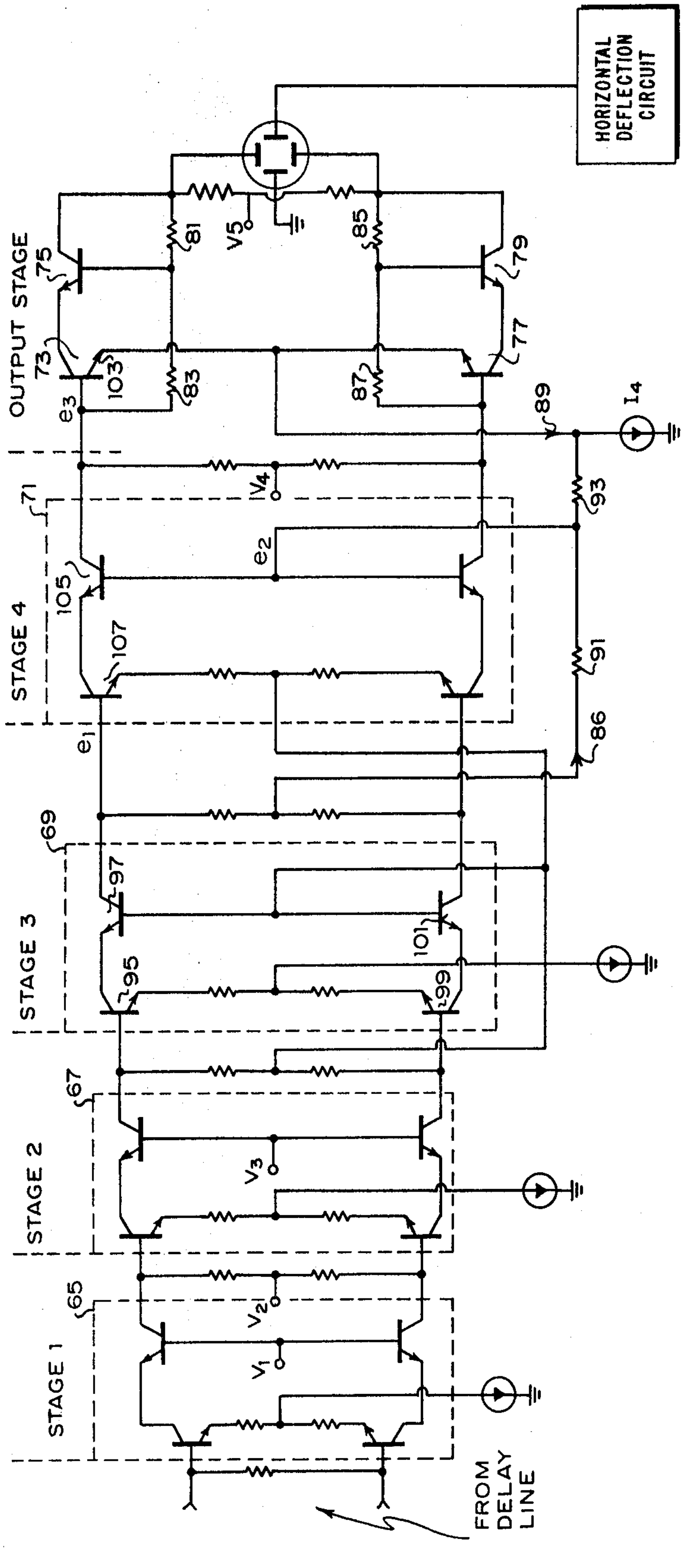

INVENTOR
ALAN J. DE VILBISS

BY A. C. Smith
ATTORNEY

INVENTOR
ALAN J. DE VILBISS
BY A. C. Smith
ATTORNEY

SIGNALLING CIRCUIT

BACKGROUND OF THE INVENTION

Certain known oscilloscope deflection circuits use gain control elements such as mechanically adjustable potentiometers which are mounted on the front control panel remote from the amplifier circuits they control. The physical size of such elements and the associated distributed capacitances introduced into the circuit thereby, together with the inductance of the wires that connect the adjustable element into the amplifier circuit, degrade high frequency and pulse signal performance. Although the size of gain elements and connecting wires within the amplifier may be greatly reduced using integrated circuit techniques remotely mounted, the gain controls and connecting wires for such amplifiers constitute the major sources of distributed reactances.

SUMMARY OF THE INVENTION

Accordingly, the present invention includes an active gain vernier or attenuator within an integrated circuit amplifier stage and the gain vernier may be adjusted by a control signal. This obviates the need for remotely mounted adjustable elements connected within the amplifier signal path and therefore eliminates a source of distributed reactances that degrade high frequency and pulse signal performance. Also, the bias current for active elements in subsequent amplifier stages near the output stage is shared with active elements in preceding stages to reduce the overall quiescent current required to operate the amplifier in the class A mode.

DESCRIPTION OF THE DRAWING AND PREFERRED EMBODIMENT

Figure 1:
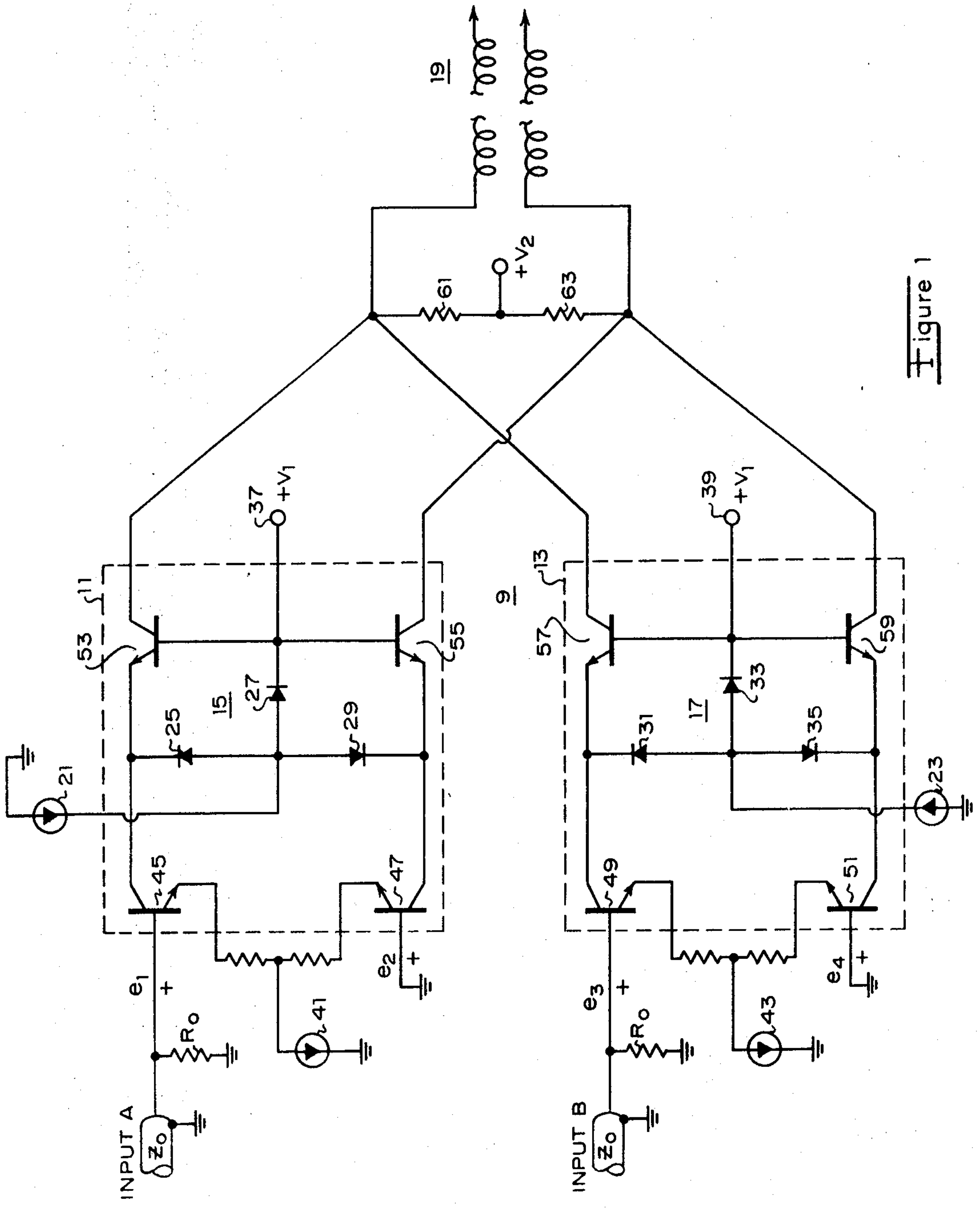

FIGS. 1 and 2 of the drawing are a schematic diagram of the present circuit. The preamplifier section 9 includes a pair of identical preamplifiers 11 and 13, each including a signal-controlled channel switch and vernier 15 and 17. The output of the preamplifier section 9 is applied through a delay line 19 to the main amplifier section, and the output of the main amplifier may be applied to a utilization circuit such as the deflection plates of a cathode-ray tube.

In operation, the overall gain of the circuit is controlled by the current sources 21 and 23. If these currents are zero for each preamplifier than all the diodes 25, 27, 29 and 31, 33, 35 are reversed biased by the bias voltages 37, 39 and currents 41, 43. Then for bias currents 41 and 43 greater than zero, the input transistors 45, 47 and 49, 51 connected in a differential configuration in each of the preamplifiers 11, 13 provide maximum differential signal gain into the following common-base, emitter-input transistor stages 53, 55, 57 and 59.

The overall gain per channel is altered by adjusting the value of the current 21 or 23. These currents are outside of the signal amplifier path for input signals and may be supplied conveniently from a remotely mounted front-panel control connected to a DC supply without introducing undesirable reactances into the signal path for input signals. Considering one channel, as the current 21 increases, the diodes 25, 29 become forward biased and the sum of the emitter currents in transistors 53 and 55 equals the current 41 less the current 21. Thus, the dynamic impedance of the series combination of diodes 25 and 29 is decreased and the combined input impedance of transistors 53 and 55 is increased. A current divider is thus formed in the signal amplifier path with diverts part of the signal currents flowing in the collectors of transistors 45 and 47 through the diodes 25 and 29. The remaining signal current passing through transistors 53 and 55 to the load resistors 61 and 63 for a given input signal is thus reduced by the application of the current 21. If the current 21 is increased further until it is larger than the current 41, then the dynamic impedance of the diodes 25 and 29 decreases further and the emitter-base junctions of transistors 53 and 55 become reversed biased and diode 27 becomes forward biased. The collector currents in the cutoff transistors 53 and 55 are reduced to zero, thereby providing isolation between the input A and load resistors 61 and 63.

Considering the other channel, the current 23 controls the dynamic impedance of the diodes 31 and 35 and the emitter input impedances of the transistors 57 and 59 in the same manner as previously described in connection with the effect of current 21. Thus, by increasing the current 23, the transistors 57 and 59 may also be cut off to provide isolation between input B and the common load resistors 61 and 62. For currents 21, 23 greater than zero but less than currents 41, 43, respectively, there common load resistors 61, 63 will thus develop across them output voltages which are the algebraic combination of the amplified signals at inputs A and B, each altered by the gain factors of the stages that are controlled by the currents 21 and 23. The combined voltages across the load resistors 61, 63 are applied to the input of a delay line 19 for delayed application to the main amplifier that is connected to the output end of the delay line 19. It should be noted that the combined voltages across the load resistors 61, 63 may alternately be selected successive periods of the input signals A and B simply by synchronously switching currents 21 and 23 between higher and lower current values in opposite phase relationship. The lower current values may be sufficient to sustain signal transmission through the respective channel at a selected overall gain factor. In this manner, the input signals A and B (and, of course, additional input signals to each of a plurality of signal channels) may be time multiplexed or "chopped" for alternate presentation on a cathode-ray oscilloscope tube. The combined voltages across resistors 61 and 63, say, momentarily due to the input A in this mode of operation, is substantially isolated from signal at input B and from the control current 23 by the cutoff transistors 57 and 59, the highly conductive shunting diodes 31, 33 and 35 and the reverse biased collector-base junctions of transistors 49 and 51. Similarly, the input A and the control current 21 are substantially isolated from the combined voltages across resistors 61 and 63 during the alternate momentary presentation of signal appearing at input B. Also, since the active elements 45, 47, 25, 27, 29, 53 and 55 of amplifier stage 11 (and the corresponding elements of amplifier stage 13) are disposed on a common semiconductor substrate in the form of an integrated circuit, the differential thermal drift problems are substantially eliminated. Also, corresponding pairs of elements, like transistors 45 and 47, etc. may be formed using identical masks and geometries to improve the gain stability and thereby obviate the need for feedback networks.

The main amplifier section receives the delayed signal at the output of the delay line 19 and supplies sufficient signal swing to drive the deflection plates of a cathode-ray oscilloscope tube. Each of the cascaded differential gain stages includes four transistors arranged in substantially identical configurations which may therefore be conveniently produced as integrated circuits 65, 67, 69 and 71. Each stage includes a pair of input transistors having input base electrodes connected to receive applied differential signals, emitter electrodes connected through resistors to common bias current sources and collector electrodes connected to emitter-input, common-base output transistors, the collectors of which are connected through load resistors to a bias supply. The transistors in the output stage are arranged in a current feedback connection per channel to minimize the signal voltage swings at its input terminals and to divide the output signal voltage across the four transistors 73–79. The output signal voltage is divided in this manner in order to decrease the $V_{CEO}$ breakdown specification required in each transistor 73–79 in the circuit. A low value of $V_{CEO}$ breakdown is preferred because a high value is usually achieved at the expense of decreased high frequency current gain ($f_T$) over a given range of operating currents. This connection also provides low output capacitance, and, with the proper choice of resistors 81, 83 and 85, 87 in the feedback network, can be made to provide a resistive output impedance with approximately matches the characteristic impedance of the deflection system for the cathode-ray oscilloscope tube. The output stage then absorbs reflections from minor discontinuities in the deflection system and its termination circuitry, thereby providing improved pulse signal response.

The preceding amplifier stages are connected so that the combined collector currents 86 in stage 69 become a major part of the emitter bias currents 89 in the output stage. This connection saves a significant amount of power dissipation in the biasing networks because an external collector supply voltage for stage 69 is not required and the emitters of the output stage transistors use the high collector source impedances of stage 69 as an efficient current source. The desired bias voltage $e_2$ for the common-base output transistors in stage 71 is also conveniently available in this connection.

Small, approximately equal voltage drops are provided by resistors 91 and 93 ($I_{86}R_{91} \cong I_{86}R_{93} \cong 1$ volt) to prevent saturation of the output transistors in stage 71 under large signal conditions. It should be noted that if the amplifier is overdriven sufficiently to cut off the transistors 95, 97 in one channel of stage 69, then the combined collector current in the transistors 99, 101 in the other channel of stage 69 is equal to the current 86 and the base voltage $e_3$ of the transistor 103 is at its minimum value. Under this condition, the common base bias voltage $e_2$ is constrained to be less than $e_3$ and the output transistor 105 in stage 71 is not saturated. Since $e_1$ is approximately 1 volt less than $e_2$ due to the voltage drop across resistor 91, saturation of input transistor 107 of stage 71 is also prevented. A similar bias-current sharing and saturation limiting arrangement may also be provided in stages 67, 69 and 71.

Therefore, the biasing circuitry used in the present amplifier thus prevents saturation of the transistors in the output stages of the amplifier under all operating signal conditions, thereby permitting rapid amplifier recovery after the amplifier is overdriven. Also, the present amplifier circuitry uses DC signals from remote sources to control the overall gain and to time multiplex the amplification of a pair of input signals. Further, bias signal power is preserved in the circuit of the present invention by sharing the bias current of a succeeding stage with the circuit elements in a preceding stage.

I claim:

1. Signalling circuit comprising:

a first pair of transistors, each having emitter, base and collector electrodes;

a second pair of transistors, each having an emitter electrode connected to a collector electrode of a transistor in the first pair and having base electrodes connected to a source of bias signal and having collector electrodes;

a third pair of transistors, each having emitter, base, and collector electrodes;

a fourth pair of transistors each having an emitter electrode connected to a collector electrode of a transistor of the third pair and having base electrodes connected to a source of bias signal and having collector electrodes;

input means connected to the base and emitter electrodes of each of the transistors of the first pair for applying input and bias signals thereto;

input means connected to the base and emitter electrode of each of the transistors of the third pair for applying input and bias signals thereto;

output means connected to the collector electrodes of the transistors of the second and fourth pairs for supplying bias signal thereto and for providing an output signal as the algebraic combination of signals from the second and fourth pairs of transistors;

first circuit means including a pair of diodes serially connected in conduction opposition between the emitter electrodes of said transistors of the second pair and having a control signal input circuit including an additional diode connected to said pair of serially connected diodes of said first circuit means;

second circuit means including a pair of diodes serially connected in conduction opposition between the emitter electrodes of said transistors of the fourth pair and having a control signal input circuit including an additional diode connected to said pair of serially connected diodes of the second circuit means;

a source of control signal coupled to the control signal input of said first circuit means for varying the conductivity thereof to alter the signal transmission between the collector electrodes of the transistor of the first pair and the emitter electrodes of the transistors of the second pair; and a second source of control signal coupled to the control signal input of said second circuit means for varying the conductivity thereof to alter the signal transmission between the collector electrodes of the transistors of the third pair and the emitter electrodes of the transistors of the fourth pair, the sources of control signals for the corresponding first circuit means and second circuit means being operated alternately in opposite phase relationship to vary the respective signal transmissions substantially to zero alternately and in opposite phase relationship.

2. An amplifier circuit comprising:

first, second and third pairs of transistors, each of the transistors in a pair having input base electrodes and emitter and collector electrodes;

for each pair of transistors, means connecting the emitter electrodes of the pair of transistors to a common bias terminal for the pair;

input means coupled to the base and emitter electrodes of the first pair of transistors for applying input and bias signals thereto; first circuit means coupled to the collector electrodes of the first pair of transistors for producing a pair of output signals from said first pair of transistors and for supplying bias thereto appearing at a first common bias input;

said first circuit means including a pair of load impedances and a pair of transistors, each having an emitter electrode connected to the collector electrode of the corresponding transistor of said first pair, and having base electrodes connected to a common terminal, and having collector electrodes connected through said load impedances to said first common bias input;

said circuit means coupled to the collector electrodes of the second pair of transistors for producing a pair of output signals from said second pair of transistors and for supplying bias thereto appearing at a second common bias input;

said second circuit means includes a pair of load impedances and a pair of transistors, each having an emitter electrode connected to the collector electrode of the corresponding transistor of said second pair, and having base electrodes connected to a common terminal, and having collector electrodes connected through said load impedance to said second common bias input;

means coupled to the input base electrodes of the second pair of transistors for applying thereto said pair of output signals from said first pair of transistors;

means coupled to the input base electrodes of the third pair of transistors for applying thereto said pair of output signals from said second pair of transistors;

feedback means including a pair of serially connected resistive elements connecting the first common bias input for said first pair of transistors to the common bias terminal for said third pair of transistors; and means connecting said common terminal of the base electrodes of the transistors in said second circuit means to said feedback means at a point intermediate the serially connected resistive elements for altering the bias conditions on the pairs of transistors in response to the levels of signals appearing thereon.